United States Patent
Joung et al.

(10) Patent No.: US 8,842,724 B1
(45) Date of Patent: Sep. 23, 2014

(54) DATA COMPRESSION AND DECOMPRESSION METHOD BETWEEN DIGITAL UNIT AND RADIO UNIT IN CLOUD RADIO ACCESS NETWORK

(71) Applicant: Innowireless Co., Ltd., Gyeonggi-do (KR)

(72) Inventors: Jin-Soup Joung, Gyeonggi-do (KR); Joo-Hyeong Lee, Seoul (KR); Yong-Hoon Lim, Seoul (KR); Hee-Jun Lee, Seoul (KR); Chul-Woo Yoo, Seoul (KR)

(73) Assignee: Innowireless Co., Ltd. (KR)

( * ) Notice: Subject to any disclaimer, the term of this patent is extended or adjusted under 35 U.S.C. 154(b) by 0 days.

(21) Appl. No.: 13/903,356

(22) Filed: May 28, 2013

(30) Foreign Application Priority Data

May 9, 2013 (KR) .................. 10-2013-0052642

(51) Int. Cl.
  *H04B 1/66* (2006.01)
  *H03M 7/30* (2006.01)
(52) U.S. Cl.
  CPC ............................ *H03M 7/3062* (2013.01)
  USPC ........................................................ 375/240

(58) Field of Classification Search
  USPC ............ 375/240; 348/14.13, 439.1; 382/166, 382/232; 386/328
  See application file for complete search history.

(56) References Cited

U.S. PATENT DOCUMENTS

| 5,838,817 A | * | 11/1998 | Funada | 382/166 |
|---|---|---|---|---|
| 6,272,246 B1 | * | 8/2001 | Takai | 382/209 |
| 6,351,569 B1 | * | 2/2002 | Kimura et al. | 382/247 |
| 2006/0008155 A1 | * | 1/2006 | Ishikawa et al. | 382/232 |
| 2008/0279463 A1 | * | 11/2008 | Son | 382/240 |
| 2011/0007976 A1 | * | 1/2011 | Sugita | 382/232 |

* cited by examiner

*Primary Examiner* — Don N Vo
(74) *Attorney, Agent, or Firm* — Kaplan Breyer Schwarz & Ottesen, LLP (57) ABSTRACT

A method of compressing In-phase/Quadrature (I/Q) data transmitted and received between a Digital Unit (DU) and a Radio Unit (RU) in a Cloud Radio Access Network (CRAN) structure is disclosed. The method includes (a) calculating a minimum value $D^i{}_{MSB}$ among meaningless higher-order bit digits $D^{i,j}{}_{MSB}$ with respect to each of j-th I/Q samples having a predetermined resolution among i-th unit blocks that are units of compression, and (b) transmitting each of the samples after each of the samples is converted into a binary number and $D^i{}_{MSB}$ number of higher-order bits, excluding a sign bit, are removed.

7 Claims, 5 Drawing Sheets

DATA COMPRESSION AND DECOMPRESSION METHOD BETWEEN DIGITAL UNIT AND RADIO UNIT IN CLOUD RADIO ACCESS NETWORK

CROSS-REFERENCE TO RELATED APPLICATION

This application claims priority to and the benefit of Korean Patent Application No. KR 10-2013-0052642, filed on May 9, 2013, the disclosure of which is incorporated herein by reference in its entirety.

BACKGROUND

1. Field of the Invention

The present invention relates to a method of compressing and decompressing In-phase/Quadrature (I/Q) data between a digital unit (DU) and a radio unit (RU) in a Cloud Radio Access Network (CRAN), and more particularly, to a method of compressing and decompressing I/Q data between the DU and the RU in the CRAN that can significantly reduce an amount of data transmitted and received between the DU and the RU in a way such that basic units of compression are defined as bundles of basic frames defined in a Common Public Radio Interface (CPRI) standard, and a header having information about an amount of data remaining after compression for each of the basic units is defined so as to be transmitted and received.

2. Discussion of Related Art

Figure 1:
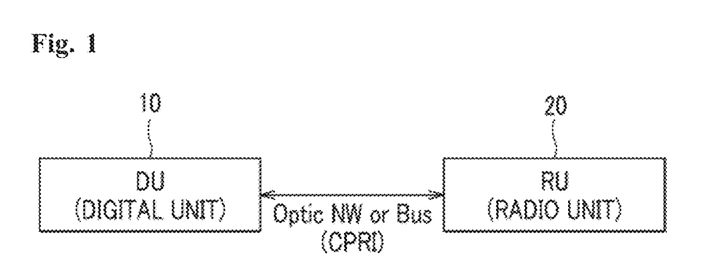
FIG. 1 is a block diagram showing a digital unit (DU) and a radio unit (RU) in an Orthogonal Frequency Division Multiplexing (OFDM) based system having a general Cloud Radio Access Network (CRAN) structure.

FIG. 1 is a block diagram showing a base station system having a general Cloud Radio Access Network (CRAN) structure. As shown in FIG. 1, in a recent base station system, the CRAN structure implemented by separating a digital signal processing unit (DU; Digital unit) 10 and a radio signal processing unit (RU; Radio Unit) 20 of the base station system has been widely introduced in order to reduce capital expenditure (CAPEX) and operational expenditure (OPEX), and to ensure efficiency of equipment development. Such a CRAN is one kind of Cloud Communication Center (CCC), and may reduce OPEX and power consumption as well as significantly increase a wireless data capacity compared to an existing system.

As described above, the DU 10 is concentrated in a DU center provided separately in a station, whereas the RU 20 is provided in a service target area far away from the DU 10. Accordingly, high-speed transmission and reception of baseband I/Q signals between the DU 10 and the RU 20 is required, and therefore the DU 10 and the RU 20 are physically connected to an optical link or an Unshielded Twisted Pair (UTP). In this instance, a plurality of frequency assignment (FA) and sector signals may be mixed between the DU 10 and the RU 20, and therefore the number of optical cables for connecting these signals may be determined in accordance with an I/Q data transfer amount.

In this manner, since the DU 10 and the RU 20 are physically far apart from each other, facility costs of the optical cable are significantly increased, and therefore it is possible to reduce CAPEX by reducing the amount of data between the DU 10 and the RU 20. A standard that is most commonly used in transmission and reception of I/Q data between the DU 10 and the RU 20 is a Common Public Radio Interface (CPRI), and a standard of the latest version (Ver 5.0) may support a line data rate of up to 9. 8304 Gbps.

Next, the RU 20 may include a frequency up-converting module, a frequency down-converting module, a power amplifier, a filter, and the like. The DU 10 may include a data processing unit for processing signals received from a terminal or signals transmitted to the terminal, and the data processing unit may be connected with a network so that the signals received from the terminal are transmitted to the network, and signals received from the network are transmitted to the terminal.

Meanwhile, in order to reduce an amount of data between the DU 10 and the RU 20, a method of reducing an amount of sampling through non-integral multiple re-sampling using a separate interpolation/decimation scheme in each of the DU 10 and the RU 20 has been proposed. Since this method implements a larger size of Fast Fourier Transform/Inverse Fast Fourier Transform (FFT/IFFT) compared to the number of subcarriers of data to be transmitted in an Orthogonal Frequency Division Multiplexing (OFDM) system, an amount of data may be reduced by reducing redundancy at frequencies through a low-pass filter and interpolation/decimation. However, there is a fundamental limitation in significantly reducing the amount of data transmitted and received between the DU and the RU using only this method.

SUMMARY OF THE INVENTION

The present invention is directed to a method of compressing and decompressing In-phase/Quadrature (I/Q) data between a digital unit (DU) and a radio unit (RU) in a Cloud Radio Access Network (CRAN), which can significantly reduce an amount of data transmitted and received between the DU and the RU in a way such that basic units of compression are defined as bundles of basic frames defined in a Common Public Radio Interface (CPRI) standard, and a header having information about an amount of data remaining after compression for each of the basic units is defined so as to be transmitted and received, thereby reducing capital expenditure (CAPEX) and operational expenditure (OPEX) of a base station.

According to an aspect of the present invention, there is provided a method of compressing I/Q data transmitted and received between a DU and an RU in a CRAN structure, the method including: (a) calculating a minimum value $D^i_{MSB}$ among meaningless higher-order bit digits $D^{i,j}_{MSB}$ with respect to each of j-th I/Q samples having a predetermined resolution among i-th unit blocks that are units of compression; and (b) transmitting each of the samples after each of the samples is converted into a binary number and $D^i_{MSB}$ amount of higher-order bits, excluding a sign bit, are removed.

In the above-described configuration, a minimum compression rate may be ensured in a way such that a maximum value $Q^i_{MSB}$ among meaningful lower-order bit digits $Q^{i,j}_{MSB}$ with respect to each of the samples is further calculated in the (a) calculating, a lower-order bit digit $P^i_{LSB}$ to be removed is calculated by deducting $D^i_{MSB}$ from the minimum number of compressed bits $B_{MIN}$ before the (b) transmitting, and the (b) transmitting (b) is performed when $P^i_{LSB}$ is 0 or smaller, whereas each of the samples is transmitted after $P^i_{LSB}$ amount of lower-order bits are further removed when $P^i_{LSB}$ is larger than 0.

In addition, the method may further include (c) additionally transmitting, in the form of a header, code word information obtained by source-coding $Q^i_{MSB}$ or $Q^i_{MSB}$ so as to decompress a reception terminal.

In addition, a lossless coding method including Huffman coding may be applied for the source-coding.

In addition, the (a) calculating to the (c) transmitting may be performed in units of unit blocks, which are small sections obtained by segmenting a basic frame defined in a Common Public Radio Interface (CPRI) standard.

In addition, $D^{i,j}_{MSB}$ may correspond to the number of higher-order bits than a bit in which 1 initially appears when the sample is a positive number, and may correspond to the number of higher-order bits than a bit in which 0 initially appears after being converted into a positive number when the sample is a negative number.

According to another aspect of the present invention, there is provided a method of decompressing I/Q data between a DU and an RU in a CRAN, the I/Q data being compressed according to the method of any one of claims 3 to 6 and received, between DU and RU in CRAN, the method including: (d) receiving binary bits of the sample and the header, and calculating $DD^{i}_{MSB}$ and $P^{i}_{LSB}$ by $Q^{i,j}_{MSB}$ confirmed from the header; and (e) restoring to an original bit resolution of the sample in a way such that the received binary bits are separated by $Q^{i,j}_{MSB}$ bits when $P^{i}_{LSB}$ is 0 or smaller and $D^{i}_{MSB}$ number of 0 bits are inserted after a sign bit that is a first bit of the separated binary bits, whereas the received binary bits are separated by $Q^{i}_{MSB} - P^{i}_{LSB}$ bits when $P^{i}_{LSB}$ is larger than 0 and $D^{i}_{MSB}$ and $P^{i}_{LSB}$ number of 0 bits are inserted after a first bit of a bit separated by $Q^{i}_{MSB} - P^{i}_{LSB}$ bits and a final bit.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Hereinafter, a method of compressing and decompressing In-phase/Quadrature (I/Q) data between a digital unit (DU) and a radio unit (RU) in a Cloud Radio Access Network (CRAN) according to an embodiment of the present invention will be described in detail with reference to the accompanying drawings.

In the following Table 1, a variety of parameters used in the method of compressing and decompressing IQ data between the DU and the RU in the CRAN according to an embodiment of the present invention are defined.

TABLE 1

| Parameters | Explanation |
|---|---|
| $d_{CompUnit}$ | Basic unit of compression That is, proposed algorithm is performed with respect to $d_{CompUnit}$ number of basic frames at a time (basic frame refers to 260.4 nsec as a time unit defined in CPRI standard) |
| Unit Block | Small sections obtained by segmenting $d_{CompUnit}$ section Digital samples included in $d_{CompUnit}$ section are divided into several Unit blocks. Samples included in the same Unit block are compressed so as to have the same Exponent after compression |
| L | Original bit resolution of digital sample |
| M | Total number of digital samples included in $d_{CompUnit}$ |
| N | The number of digital samples included in each Unit Block |
| K | The number of Unit blocks included in $d_{CompUnit}$ |
| $B^i$ | i-th Unit Block (i = 1, 2, . . . , K) |
| $S^{i,j}$ | j-th digital sample of i-th Unit Block (j = 1, 2, . . . , N) |
| $D_{MSB}^{i,j}$ | Meaningless higher-order bit digit of j-th digital sample of i-th Unit Block, that is, refers to bits that do not affect corresponding sample value Positive value –> the number of higher-order bits than bit in which 1 initially appears Negative value –> the number of higher-order bits than bit in which 0 initially appears after being converted into positive number |
| $Q_{MSB}^{i,j}$ | Meaningful lower-order bit digit of j-th digital sample of i-th Unit Block (corresponding to Exponent value) $Q_{MSB}^{i,j} = L - D_{MSB}^{i,j}$ |
| $D^{i}_{MSB}$ | Minimum value among $D_{MSB}^{i,j}$ values of arbitrary i-th Unit Block $D_{MSB}^{i} = \min\{D_{MSB}^{i,1}, D_{MSB}^{i,2}, \ldots, D_{MSB}^{i,N}\}$ for a given i |
| $Q^{i}_{MSB}$ | Maximum value among $Q_{MSB}^{i,j}$ values of arbitrary i-th Unit Block $Q_{MSB}^{i} = \max\{Q_{MSB}^{i,1}, Q_{MSB}^{i,2}, \ldots, Q_{MSB}^{i,N}\}$ for given i |
| $B_{MIN}$ | Minimum number of compressed bits. The number of compressed bits per sample should be $B_{MIN}$ or larger. This value is provided to compression terminal and restoration terminal in advance, or is transmitted from compression terminal to restoration terminal only once before transmitting data. |
| $E_{TX}^{i}$ | Exponent value actually used when transmitting digital samples included in $B^i$. Exponents after compression of samples included in $B^i$ are all the same as $E_{TX}^{i}$. |
| $E_{Header}^{i}$ | Exponent values of digital samples included in $B^i$ informing decompression terminal through header or the like. $E_{Header}^{i}$ may be specific code value corresponding to each of Exponent values for improving compression efficiency. For example, transmitting result code value after performing Huffman coding with respect to Exponents occur in $d_{CompUnit}$ |
| $P^{i}_{LSB}$ | Subtracting the number of meaningless higher-order bits of i-th Unit Block from the minimum number of compressed bits. When this value is 0 or smaller, compression sufficiently satisfying minimum compression bit is possible through MSB removal, and when this value is 1 or larger, $P^{i}_{LSB}$ number of LSBs are removed and compressed $P^{i}_{LSB} = B_{MIN} - D_{MSB}^{i}$ |

Figure 2:
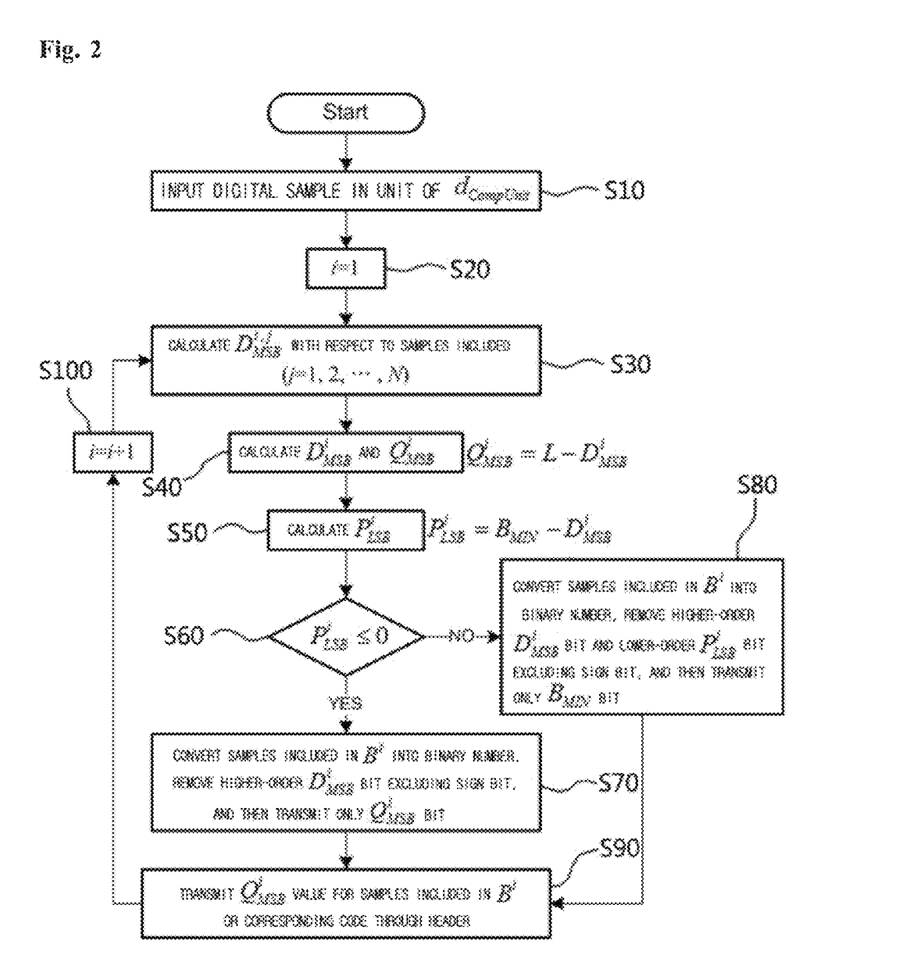
FIG. 2 is a flowchart showing a method of compressing In-phase/Quadrature (I/Q) data between a DU and an RU in a CRAN according to an embodiment of the present invention.

FIG. 2 is a flowchart showing a method of compressing I/Q data between a DU and an RU in a CRAN according to an embodiment of the present invention. As shown in FIG. 2, in the method of compressing I/Q data between the DU and the RU in the CRAN according to an embodiment of the present invention, in step S10, the method may receive a digital I/Q sample (hereinafter, simply referred to as "sample") in a unit of $d_{CompUnit}$, which is a basic unit of compression.

Next, in step S20, "i" representing an order of unit blocks that are small sections obtained by segmenting $d_{CompUnit}$ may be set as 1.

In step S30, a meaningless higher-order bit digit $D^{i,j}_{MSB}$ in a j-th sample of the i-th unit block $B^i$ may be calculated. Here, $D^{i,j}_{MSB}$ may denote bits that do not affect corresponding sample values even though the bits are removed. $D^{i,j}_{MSB}$ may correspond to the number of higher-order bits than a bit in which 1 initially appears when the sample is a positive number, and may correspond to the number of higher-order bits than a bit in which 0 initially appears after being converted into a positive number when the sample is a negative number.

Figure 3:
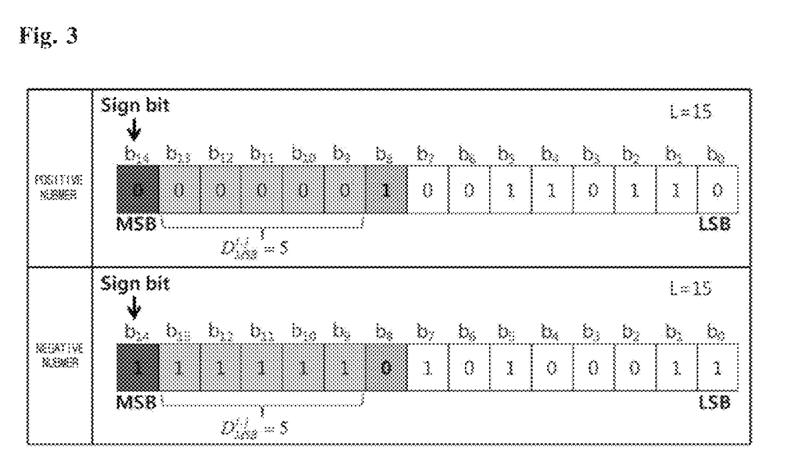
FIG. 3 is a diagram showing an example of $D^{i,j}_{MSB}$ referring to bits that do not affect corresponding sample values even though the bits are removed according to an embodiment of the present invention.

FIG. 3 is a diagram showing an example of $D^{i,j}_{MSB}$ referring to bits that do not affect corresponding sample values even though the bits are removed according to an embodiment of the present invention. In FIG. 3, an example in which an original bit resolution L of the digital sample is 15, and a signed 2's complement is used. As shown in FIG. 3, when the sample is a positive number, $D^{i,j}_{MSB}$ is 5, corresponding to the number of bits $b_9$ to $b_{13}$, which are higher-order bits than $b_8$, which is the bit in which 1 initially appears. When the sample is a negative number, $D^{i,j}_{MSB}$ is 5, corresponding to the number of bits $b_9$ to $b_{13}$, which are higher-order bits than $b_8$, which is the bit in which 0 initially appears after conversion into a positive value.

Next, in step S40, a minimum value $D^{i}_{MSB}$ among $D^{i,j}_{MSB}$ of the i-th unit block, and a maximum value $Q^{i}_{MSB}$ among $Q^{i,j}_{MSB}$, which is a meaningful lower-order bit digit (corresponding to an exponent value) of the j-th sample of the i-th unit block, may be calculated. Here, $Q^{i,j}_{MSB}$ and $Q^{i}_{MSB}$ may be calculated by the following Equations 1 and 2:

$$Q^{i,j}_{MSB} = L - D^{i,j}_{MSB} \quad \text{[Equation 1]}$$

$$Q^{i}_{MSB} = L - D^{i}_{MSB} \quad \text{[Equation 2]}$$

Next, in step S50, a value $P^{i}_{LSB}$ obtained by subtracting the number of the meaningless higher-order bits of the i-th unit block from the minimum number of compressed bits may be calculated by the following Equation 3:

$$P^{i}_{LSB} = B_{MIN} - D^{i}_{MSB} \quad \text{[Equation 3]}$$

In step S60, it may be determined whether $P^{i}_{LSB}$ is 0 or smaller. Here, when $P^{i}_{LSB}$ is 0 or smaller, the method may proceed to step S70. In step S70, samples included in $B^i$ may be converted into a binary number, a higher-order $D^{i}_{MSB}$ bit excluding a sign bit may be removed, and then only a $Q^{i}_{MSB}$ bit may be transmitted. On the other hand, when $P^{i}_{LSB}$ is larger than 0, the method may proceed to step S80. In step S80, the samples included in $B^i$ may be converted into a binary number, a higher-order $D^{i}_{MSB}$ bit and a lower-order $P^{i}_{LSB}$ bit excluding a sign bit may be removed, and then only a $B_{MIN}$ bit may be transmitted.

Next, in step S90, a $Q^{i}_{MSB}$ value for the samples included in $B^i$ or a corresponding code may be transmitted through a header.

Next, in step Sd100, i may be increased by 1 and then the method may return to step S30.

Figure 4:
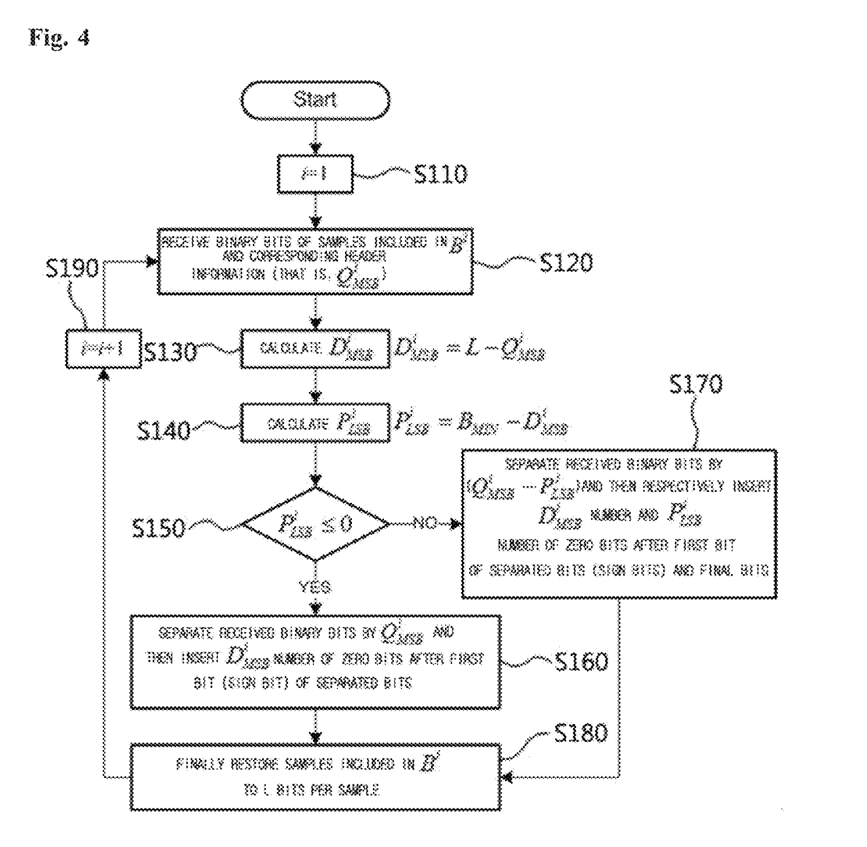
FIG. 4 is a flowchart showing a method of decompressing data compressed by the method of FIG. 2.

FIG. 4 is a flowchart showing a method of decompressing data compressed by the method of FIG. 2. As shown in FIG. 4, in step S110, i may be set as 1, and in step S120, binary bits of samples included in an i-th unit block $B^i$ and corresponding header information $Q^{i}_{MSB}$ may be received.

Next, in step S130, $D^{i}_{MSB}$ and $D^{i}_{MSB}$ may be calculated by the above Equation 2.

In step S140, $P^{i}_{LSB}$ and $P^{i}_{LSB}$ may be calculated by the above Equation 3.

In step S150, it may be determined whether $P^{i}_{LSB}$ is 0 or smaller. Here, when $P^{i}_{LSB}$ is 0 or smaller, the method may proceed to step S160. In step S160, an amount $Q^{i}_{MSB}$ of the received binary bits may be separated, and then $D^{i}_{MSB}$ number of 0 bits may be inserted after a first bit, e.g., a sign bit, of the separated bits. On the other hand, when $P^{i}_{LSB}$ is larger than 0, the method may proceed to step S170. In step S170, ($Q^{i}_{MSB} - P^{i}_{LSB}$) number of the received binary bits may be separated, and then $D^{i}_{MSB}$ and $P^{i}_{LSB}$ number of 0 bits may be respectively inserted after a first bit of the separated bits, that is, a sign bit and a final bit.

In step S180, the samples included in $B^i$ may be restored to L bits sample. Next, in step S190, i may be increased by 1, and the method may then return to step S120.

The following Table 2 shows an example of setting parameters in a case in which M=16, K=4, N=4, L=15, and $B_{MIN}$=6 are satisfied in the method of compressing and decompressing the I/Q data according to an embodiment of the present invention.

TABLE 2

| | i | | | | | | | | | | | | | | | |
|---|---|---|---|---|---|---|---|---|---|---|---|---|---|---|---|---|
| | 1 | | | | 2 | | | | 3 | | | | 4 (=K) | | | |
| j | 1 | 2 | 3 | 4 (=N) | 1 | 2 | 3 | 4 (=N) | 1 | 2 | 3 | 4 (=N) | 1 | 2 | 3 | 4 (=N) |
| Digital sample | $S^{1,1}$ 43 | $S^{1,2}$ 46 | $S^{1,3}$ 30 | $S^{1,4}$ -150 | $S^{2,1}$ -96 | $S^{2,2}$ -175 | $S^{2,3}$ -205 | $S^{2,4}$ -151 | $S^{3,1}$ -207 | $S^{3,2}$ -118 | $S^{3,3}$ 43 | $S^{3,4}$ 177 | $S^{4,1}$ 187 | $S^{4,2}$ 223 | $S^{4,3}$ 358 | $S^{4,4}$ 165 |
| $D_{MSB}^{i,j}$ | 8 | 8 | 9 | 7 | 7 | 6 | 6 | 7 | 6 | 7 | 8 | 6 | 6 | 6 | 5 | 6 |
| $D_{MSB}^{i}$ | | | 7 | | | | 6 | | | | 5 | | | | 5 | |
| $Q_{MSB}^{i,j}$ | 7 | 7 | 6 | 8 | 8 | 9 | 9 | 8 | 9 | 8 | 7 | 9 | 9 | 9 | 10 | 9 |
| $Q_{MSB}^{i}$ | | | 8 | | | | 9 | | | | 9 | | | | 10 | |
| $B_{MSB}$ | | | | | | | | 6 | | | | | | | | |
| $P_{LSB}^{i}$ | | -1 (Case I) | | | 0 (Case I) | | | | 0 (Case I) | | | | 1 (Case II) | | | |
| $E_{TX}^{i}$ | | 8 (=$Q_{MSB}^{1}$) | | | 9 (=$Q_{MSB}^{2}$) | | | | 9 (=$Q_{MSB}^{3}$) | | | | 9 (=L - $B_{MIN}$) | | | |
| $E_{Header}^{i}$ | | 8 (=$Q_{MSB}^{1}$) | | | 9 (=$Q_{MSB}^{2}$) | | | | 9 (=$Q_{MSB}^{3}$) | | | | 10 (=$Q_{MSB}^{4}$) | | | |

In the above Table 2, $D^{i}_{MSB}$ is calculated for each of 4 samples when N=4 is satisfied, and bits to be actually compressed in units of N samples are determined compared to the minimum number of compressed bits $B_{MIN}$, which is a design parameter. In this instance, when $D^{i}_{MSB}$ is larger than or equal to $B_{MIN}$ (case I), the samples may be compressed according to a method of removing $D^{i}_{MSB}$ (excluding a sign bit) amount of higher-order bits starting from the Most significant Bit (MSB) of the N sample, and the compressed samples may be transmitted. In this process, the $Q^{i}_{MSB}$ value and a code (for example, Huffman code or the like) corresponding to the $Q^{i}_{MSB}$ value may be transmitted through a header, so that a reception terminal may perform restoration (decompression).

On the other hand, when $D^{i}_{MSB}$ is smaller than $B_{MIN}$ (case II in Table 2), a minimum compressed bit condition may be satisfied by additionally removing $P^{i}_{LSB}$ number of bits from the Least significant Bit (LSB) as well as the MSB. In this case (case II in Table 2), a partial loss of data bits may occur, but a compressed parameter may be set to satisfy an Error Vector Magnitude (EVM) deterioration condition due to compression, for example, to be 1% or less.

Figure 5:
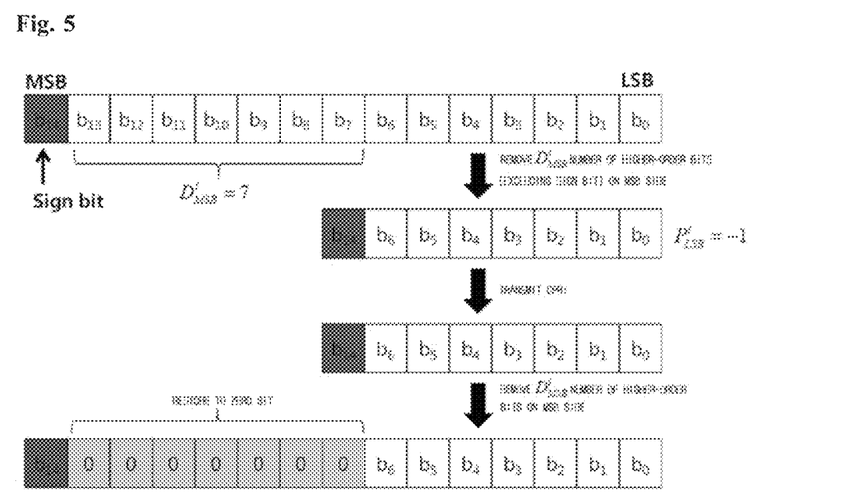
FIG. 5 is a diagram showing an example of a data compression and decompression process in a case in which $D^{i}_{MSB} \geq B_{MIN}$ is satisfied according to an embodiment of the present invention.

FIG. 5 is a diagram showing an example of a data compression and decompression process in a case in which $D^i_{MSB} \geq B_{MIN}$ is satisfied according to an embodiment of the present invention. An example of FIG. 5 in which $D^i_{MSB}$ is 7 and $B_{MIN}$ is 6 may correspond to the case I of Table 2, and therefore a transmission terminal may transmit data while removing from the data $b_7$ to $b_{13}$, which are bits corresponding to $D^i_{MSB}$, and compressing the data, and a reception terminal may decompress the compressed data by inserting 0s into $b_7$ to $b_{13}$.

Figure 6:
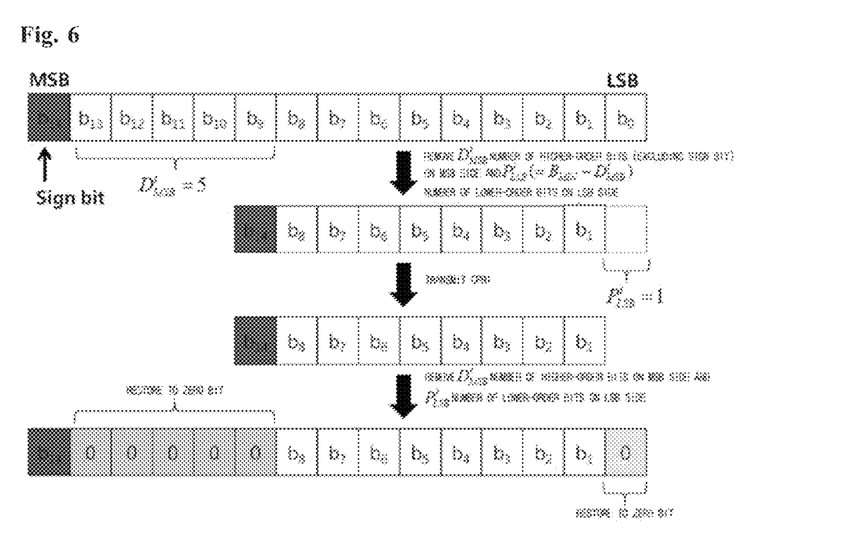
FIG. 6 is a diagram showing an example of a data compression and decompression process in a case in which $D^{i}_{MSB} < B_{MIN}$ is satisfied according to an embodiment of the present invention.

FIG. 6 is a diagram showing an example of a data compression and decompression process in a case in which $D^i_{MSB} < B_{MIN}$ is satisfied according to an embodiment of the present invention.

An example of FIG. 6 in which $D^i_{MSB}$ is 5 and $B_{MIN}$ is 6 may correspond to the case II of Table 2. Therefore, a transmission terminal may compress data by removing from the data bits $b_9$ to $b_{13}$ corresponding to $D^i_{MSB}$, and further removing from the data $P^i_{LSB}$ number of LSB side lower-order bits, e.g., $b_0$, and may then transmit the compressed data. In addition, a reception terminal may decompress the compressed data by filling $b_9$ to $b_{13}$ and $b_o$ with 0s.

The I/Q data generated after performing the IFFT operation may be approximated as Gaussian noise of multicarrier signals, and the approximated signals may have a large Peak-to-Average Power Ratio (PAPR). A case in which a size of the signal subjected to the IFFT operation is large corresponds to a case in which lower-order bits of a sample do not have a relatively large meaning compared to the signal size, and a case in which the size of the signal subjected to the IFFT operation is small corresponds to a case in which higher-order bits of the sample are meaningless, because the higher-order bits of the sample are filled with meaningless values.

Therefore, in the method of compressing and decompressing the I/Q data according to an embodiment of the present invention, by removing lower-order bits when a value of an input sample is relatively large, and removing higher-order bits when the value of the input sample is relatively small, the I/Q data can be effectively compressed without any loss, and therefore a transmission terminal and a reception terminal can compress and decompress data by transmitting variable bit removal information in a separate header.

In addition, in the method of compressing and decompressing the I/Q data according to an embodiment of the present invention, a minimum compression rate can be ensured, thereby stably performing mixing of data transmitted through a CPRI or the like. The input sample can be basically compressed without any loss, and lower-order bits (LSBs) can be additionally removed only in a case in which a minimum compressed bit condition cannot be satisfied, thereby compressing data while minimizing loss of data bits.

The header information may be shared in the transmission terminal and the reception terminal through a separate lookup table, and separate encoding/decoding, for example, a Huffman encoding/decoding algorithm may be applied in order to reduce an amount of data of the header.

Meanwhile, delay for compression/decompression may differ in accordance with a size of a compression unit, and may be determined as shown in the following Equation 4 based on trade-off between a compression rate and delay.

$$\text{delay} = d_{CompUnit} * 0.26 \, [\mu sec] \quad \text{[Equation 4]}$$

In the following Table 4, when L=15 and $B_{MIN}$=8 are set, a simulation test result of a data compression rate and EVM deterioration due to compression by generating Long Term Evolution (LTE) 10 MHz 64Quadrature Amplitude Modulation (QAM) signals is shown. The EVM deterioration is less than 0.02%, and compression of about 40% or more may be possible.

TABLE 3

| $d_{CompUnit}$ [Basic Frame] | EVM deterioration [%] | Compression rate [%] Total | Guaranteed | Delay [usec] |
|---|---|---|---|---|
| 1 | 0.0113 | 41.53 | −5 | 0.260 |
| 2 | 0.0113 | 45.34 | 20.83 | 0.521 |
| 4 | 0.0113 | 47.55 | 33.75 | 1.042 |
| 8 | 0.0113 | 48.77 | 40.21 | 2.083 |
| 16 | 0.0113 | 49.39 | 43.44 | 4.167 |
| 32 | 0.0113 | 49.65 | 45.05 | 8.333 |
| 64 | 0.0113 | 49.8 | 45.86 | 16.667 |
| 128 | 0.0113 | 49.95 | 46.26 | 33.333 |

As described above, according to an embodiment of the present invention, the method of compressing and decompressing the I/Q data between the DU and the RU in the CRAN may significantly reduce an amount of data transmitted and received between the DU and the RU in a way such that basic units of compression are defined as bundles of basic frames defined in a Common Public Radio Interface (CPRI) standard, and compression related header information is additionally transmitted and received, whereby a plurality of sectors or carrier signals may be transmitted to the same optical cable. As a result, it is possible to reduce capital expenditure (CAPEX) and operational expenditure (OPEX) for networking between the DU and RU.

In addition, according to an embodiment of the present invention, since a stable system operation is possible when a minimum compression rate is ensured in application of compression based on the CPRI standard, the method of compressing and decompressing the I/Q data between the DU and the RU in the CRAN may designate a momentary compression rate which should be minimally attained by satisfying a limiting condition in which a bit resolution of each of result samples obtained by performing compression cannot exceed a maximum bit resolution set by a user.

In addition, an amount of a header may be reduced by applying a source coding scheme to a header that is additionally generated for compression/restoration, and therefore the method according to an embodiment of the present invention, which is an independent concept from a conventional compression method by re-sampling, may be applied simultaneously together with the existing method, thereby obtaining an additional compression effect beyond that provided by the existing method.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of compressing In-phase/Quadrature (I/Q) data transmitted and received between a Digital Unit (DU) and a Radio Unit (RU) in a Cloud Radio Access Network (CRAN) structure, the method comprising:

(a) calculating a minimum value $D^i_{MSB}$ among meaningless higher-order bit digits $D^{i,j}_{MSB}$ with respect to each of j-th I/Q samples having a predetermined resolution among i-th unit blocks that are units of compression; and (b) transmitting each of the samples after each of the samples is converted into a binary number and $D^i_{MSB}$ number of higher-order bits, excluding a sign bit, are removed.

2. The method of claim 1, wherein a minimum compression rate is ensured in a way such that a maximum value $Q^i_{MSB}$ among meaningful lower-order bit digits $Q^{i,j}_{MSB}$ with respect to each of the samples is further calculated in the (a) calculating, a lower-order bit digit $P^i_{LSB}$ to be removed is calculated by deducting $D^i_{MSB}$ from the minimum number of compressed bits $B_{MIN}$ before the (b) transmitting, and the (b) transmitting is performed when $P^i_{LSB}$ is 0 or smaller, whereas each of the samples is transmitted after further removing $P^i_{LSB}$ number of lower-order bits when $P^i_{LSB}$ is larger than 0.

3. The method of claim 2, wherein the (a) calculating to the (c) transmitting are performed in units of unit blocks, which are small sections obtained by segmenting a basic frame defined in a Common Public Radio Interface (CPRI) standard.

4. The method of claim 2, wherein $D^{i,j}_{MSB}$ corresponds to the number of higher-order bits than a bit in which 1 initially appears when the sample is a positive number, and corresponds to the number of higher-order bits than a bit in which 0 initially appears after being converted into a positive number when the sample is a negative number.

5. The method of claim 2, further comprising:

(c) additionally transmitting, in the form of a header, code word information obtained by source-coding $Q^i_{MSB}$ so as to decompress a reception terminal.

6. The method of claim 5, wherein a lossless coding method including Huffman coding is applied for the source-coding.

7. A method of decompressing I/Q data between a DU and an RU in a CRAN, the I/Q data being compressed according to the method of claim 5 and received, between DU and RU in CRAN, the method comprising:

(d) receiving binary bits of the sample and the header, and calculating $Q^{i,j}_{MSB}$, which is confirmed from the header, bits of $D^i_{MSB}$ and $P^i_{LSB}$; and (e) restoring to an original bit resolution of the sample in a way such that the received binary bits are separated by $Q^{i,j}_{MSB}$ bits when $P^i_{LSB}$ is 0 or smaller, and $D^i_{MSB}$ number of 0 bits are inserted after a sign bit that is a first bit of the separated binary bits, whereas the received binary bits are separated by $Q^i_{MSB}-P^i_{LSB}$ bits when $P^i_{LSB}$ is larger than 0 and $D^i_{MSB}$ and $P^i_{LSB}$ number of 0 bits are inserted after a first bit of a bit separated by $Q^i_{MSB}-P^i_{LSB}$ bits and a final bit.

* * * * *